(12) United States Patent
Wu et al.

(10) Patent No.: US 12,557,324 B2
(45) Date of Patent: Feb. 17, 2026

(54) SEMICONDUCTOR POWER DEVICE AND METHOD FOR MANUFACTURING THE SAME

(71) Applicant: GANEXT (ZHUHAI) TECHNOLOGY CO., LTD, Guangdong (CN)

(72) Inventors: Yifeng Wu, Guangdong (CN); Fanming Zeng, Guangdong (CN)

(73) Assignee: GANEXT (ZHUHAI) TECHNOLOGY CO., LTD, Guangdong (CN)

(*) Notice: Subject to any disclaimer, the term of this patent is extended or adjusted under 35 U.S.C. 154(b) by 0 days.

(21) Appl. No.: 18/656,631

(22) Filed: May 7, 2024

(65) Prior Publication Data
US 2024/0304714 A1    Sep. 12, 2024

(30) Foreign Application Priority Data
Mar. 7, 2023   (CN) .......................... 202310206900.0

(51) Int. Cl.
*H01L 29/778* (2006.01)
*H10D 30/01* (2025.01)
(Continued)

(52) U.S. Cl.
CPC ......... *H10D 30/475* (2025.01); *H10D 30/015* (2025.01); *H10D 62/357* (2025.01); *H10D 64/112* (2025.01); *H10D 62/10* (2025.01)

(58) Field of Classification Search
CPC ............. H01L 29/7786; H01L 29/1075; H01L 29/404; H01L 29/66462; H01L 29/0603;
(Continued)

(56) References Cited

U.S. PATENT DOCUMENTS 5,464,994 A * 11/1995 Shinohe ............... H10D 64/291
257/153
7,456,484 B2 * 11/2008 Ozeki .................. H10D 12/032
257/E29.066
(Continued)

FOREIGN PATENT DOCUMENTS

CN         102820325 A     12/2012
CN         103117294 A      5/2013
(Continued)

*Primary Examiner* — Jay C Kim
(74) *Attorney, Agent, or Firm* — Yue (Robert) Xu; Apex Attorneys at Law, LLP

(57) ABSTRACT

A semiconductor power device and a method for manufacturing the same. The semiconductor power device comprises the back electrode, the substrate layer, the insulating buffer layer, the channel layer, the barrier layer, the dielectric layer, and the passivation layer, which are stacked sequentially from bottom to top. The substrate layer comprises a conductive substrate portion and an insulating substrate portion. The insulating buffer layer comprises a control region located above the conductive substrate portion, a high-voltage insulation region located beneath a drain electrode and above the insulating substrate portion, and a drift region between the control region and the high-voltage insulation region. The semiconductor power device has improved dynamic resistance characteristics, improved high voltage performances, and reduced parasitic capacitance.

16 Claims, 8 Drawing Sheets

(51) Int. Cl.
*H10D 30/47* (2025.01)
*H10D 62/17* (2025.01)
*H10D 64/00* (2025.01)
*H10D 62/10* (2025.01)

(58) Field of Classification Search
CPC .. H10D 30/475; H10D 30/015; H10D 62/357; H10D 64/112; H10D 62/10; H10D 64/111; H10D 62/8503; Y02B 70/10
See application file for complete search history.

(56) References Cited

U.S. PATENT DOCUMENTS

| | | | | |
|---|---|---|---|---|
| 9,076,763 | B2 * | 7/2015 | Ostermaier | H01L 29/205 |
| 9,306,051 | B2 * | 4/2016 | Miura | H01L 29/7783 |
| 9,331,191 | B2 * | 5/2016 | Colino | H01L 29/66462 |
| 9,356,045 | B2 * | 5/2016 | Comeau | H01L 27/1207 |
| 9,660,064 | B2 * | 5/2017 | Dasgupta | H01L 21/30612 |
| 9,818,692 | B2 * | 11/2017 | Roberts | H01L 27/095 |
| 10,854,734 | B1 | 12/2020 | Shih et al. | |
| 2013/0146946 | A1 * | 6/2013 | Tsurumi | H01L 29/78 257/192 |
| 2015/0340485 | A1 | 11/2015 | Cheng et al. | |
| 2016/0005845 | A1 | 1/2016 | Kim et al. | |
| 2018/0204941 | A1 | 7/2018 | Odnoblyudov et al. | |
| 2021/0098628 | A1 * | 4/2021 | Lv | H01L 21/477 |
| 2023/0122090 | A1 * | 4/2023 | Fiorenza | H01L 21/02458 257/76 |

FOREIGN PATENT DOCUMENTS

| | | | |
|---|---|---|---|
| CN | 114156181 A | 3/2022 | |
| CN | 114744024 A * | 7/2022 | H01L 29/06 |
| CN | 114759096 A | 7/2022 | |
| CN | 116072724 A * | 5/2023 | H01L 29/778 |

* cited by examiner

SEMICONDUCTOR POWER DEVICE AND METHOD FOR MANUFACTURING THE SAME

The present application claims priority to Chinese Patent Application No. 202310206900.0, titled "SEMICONDUCTOR POWER DEVICE AND METHOD FOR MANUFACTURING THE SAME", filed on Mar. 7, 2023 with the China National Intellectual Property Administration, which is incorporated herein by reference in its entirety.

FIELD

The present disclosure relates to the technical field of semiconductor devices, and in particular to a semiconductor power device and a method for manufacturing the semiconductor power device.

BACKGROUND

When designing a semiconductor power device, a field plate structure is usually provided for improving high voltage performances of the device. For example, a conductive equipotential body extending from a source or a gate is provided for modulating an electric field in a depletion region, so as to improve distribution of the electric field. Thereby, the distribution of the electric field may be more uniform in the depletion region, which avoids local breakdown and improves the capability of voltage blocking between a drain and the gate.

In traditional semiconductor power devices, a substrate in a lateral chip is grounded, and thus the conductive materials covering the back side of the chip constitutes an integral back field plate. During operations of the device, this kind of back side field plate will lead to a localized electric field between the drain and the substrate. So, such structure will be not beneficial for improving on high voltage performances of the device and reducing off-state leakage current of device, and may even introduce additional parasitic capacitance. Some studies have been carried out to alleviate this effect. In the first solution, an annular isolation trench is formed through etching and surrounds a region covered by a projection of the drain electrode on the silicon substrate, and the substrate in the region surrounded by the isolation trench is retained. Thereby, leakage paths in the substrate between the drain and the source as well as between the drain and the gate are suppressed. Such a solution focuses on addressing the current leakage among the drain, the gate, and the source, which are horizontally arranged. Since it does not remove the substrate beneath the drain at all, the issue of high electric field between the drain and the substrate is not addressed, which means voltage blocking of the device and dynamic resistance issue are not fully solved. In the second solution, the silicon substrate which is covered by a projection of the entire active region of the device on the substrate is removed, a layer of aluminum nitride is deposited at the back side of the substrate, and a copper layer is coated through evaporation at a surface of the aluminum nitride for heat dissipation. In this case, insulating layers beneath the channel has a floating potential set, and the electric field in such region is not optimized at all, which leads to dynamic resistance of the channel out of control. Therefore, a method to simultaneously improve dynamic resistance characteristics, enhance high voltage performances, and reduce parasitic capacitance of semiconductor power devices, is still not available.

SUMMARY

A semiconductor power device and a method for manufacturing the semiconductor power device are provided according to embodiments of the present disclosure. Dynamic resistance characteristics are improved, high voltage performances are improved, and parasitic capacitance is reduced for semiconductor power devices.

In a first aspect, a semiconductor power device is provided according to an embodiment of the present disclosure. The semiconductor power device comprises: a back electrode, a substrate layer, an insulating buffer layer, a channel layer, a barrier layer, a dielectric layer, and a passivation layer, which are stacked in the above-listed sequence from bottom to top. An upper surface of a source electrode and an upper surface of a drain electrode are embedded in the passivation layer. The source electrode and the drain electrode go through the dielectric layer and contact the barrier layer. Or, the source electrode and the drain electrode go through the dielectric layer and barrier layer and contact the channel layer, and a lower surface of the source electrode and a lower surface of the drain electrode are embedded in the channel layer. A gate electrode and a gate field plate are disposed in the passivation layer. The substrate layer comprises a conductive substrate portion and an insulating substrate portion, and there is a preset distance between a boundary, which is between the conductive substrate portion and the insulating substrate portion, and the gate field plate. The insulating buffer layer comprises a control region, a high-voltage insulation region, and a drift region, the control region extends from an edge of the source electrode facing the gate electrode to the boundary between the conductive substrate portion and the insulating substrate portion, the high-voltage insulation region is located beneath the drain electrode, and the drift region is between the high-voltage insulation region and the control region.

In an embodiment, the preset distance ranges from 2 um to 20 um.

In an embodiment, a back electrode corresponding to the insulating substrate portion has a structure of a dual-level back field plate or a multi-level back field plate.

In an embodiment, a material of the insulating substrate portion is diamond.

In an embodiment, the semiconductor power device further comprises an aluminum nitride layer located between the barrier layer and the channel layer.

In an embodiment, the insulating buffer layer is doped and the channel layer is not doped.

In a second aspect, a method for manufacturing a semiconductor power device is provided according to an embodiment of the present disclosure. The method comprises: growing, on a substrate layer, an insulating buffer layer, a channel layer, a barrier layer, and a dielectric layer which are stacked in the above-listed sequence from bottom to top; removing the dielectric layer at a position of a source electrode and a position of a drain electrode, or removing the dielectric layer, the barrier layer, and a portion of the channel layer, which are at a position of a source electrode and a position of a drain electrode; forming a source metal at the position of source electrode, and forming a drain metal at the position of the drain electrode; depositing a passivation layer on an upper surface of the dielectric layer, where a position of a gate electrode and a position of a gate field plate are determined in the passivation layer, the gate electrode is formed at the position of the gate electrode, and the gate field plate is formed at the position of the gate field plate; removing the substrate layer beneath a drift region and a high-voltage insulation region, which are of the insulating buffer layer, to form a back trench, where the insulating buffer layer comprises a control region, the drift region, and the high-voltage insulation region, the high-voltage insulation region is located beneath the drain electrode, the control region extends from an edge of the source electrode facing the gate electrode to a boundary between a conductive substrate portion and an insulating substrate portion, the drift region is between the high-voltage insulation region and the control region, and there is a preset distance between the boundary, which is between the conductive substrate portion and the insulating substrate portion, and the gate field plate; depositing an insulating material that fills the back trench fully to obtain the substrate layer comprising the conductive substrate portion and the insulating substrate portion; and coating a back electrode at a back side of the substrate layer through evaporation.

In an embodiment, before removing the substrate layer beneath the drift region and the high-voltage insulation region of the insulating buffer layer, the method further comprises: thinning the substrate layer to a preset thickness through grinding.

In an embodiment, thermal conductivity of the insulating material is greater than thermal conductivity of the conductive substrate portion. After depositing the insulating material that fills the back trench fully and before coating the back electrode at the back side of the substrate layer through the evaporation, the method further comprises: thinning the substrate layer to a preset thickness through grinding.

In an embodiment, the preset distance ranges from 2 um to 20 um.

In an embodiment, the back electrode has a structure of a dual-level back field plate or a multi-level back field plate.

In an embodiment, the insulating material is diamond.

In an embodiment, growing, on the substrate layer, the insulating buffer layer, the channel layer, the barrier layer, and the dielectric layer, which are stacked in the above-listed sequence from bottom to top comprises: growing, on the substrate layer, the insulating buffer layer, the channel layer, an aluminum nitride layer, the barrier layer, and the dielectric layer, which are stacked in the above-listed sequence from bottom to top. Removing the dielectric layer at the position of the source electrode and the position of the drain electrode, or removing the dielectric layer, the barrier layer, and the portion of the channel layer, which are at the position of the source electrode and the position of the drain electrode comprises: removing the dielectric layer at the position of the source electrode and the position of the drain electrode, or removing the dielectric layer, the aluminum nitride layer, the barrier layer, and the portion of the channel layer, which are at the position of the source electrode and the position of the drain electrode.

The semiconductor power device and the method of manufacturing the semiconductor power device according to the above technical solutions have at least following advantages.

Herein the semiconductor power device comprises the back electrode, the substrate layer, the insulating buffer layer, the channel layer, the barrier layer, the dielectric layer, and the passivation layer, which are stacked sequentially from bottom to top. A conventional homo-conductive substrate layer is replaced with the hybrid substrate layer comprising the conductive substrate portion and the insulating substrate portion. The insulating buffer layer comprises the control region, the drift region, and the high-voltage insulation region. The conductive substrate portion is located beneath the control region, and the insulating substrate portion is located beneath the drift region and high-voltage insulation region. In such structure, the conductive substrate beneath the drain is removed and replaced with the insulating substrate portion, such that an intensity of a vertical electric field beneath the drain can be significantly reduced in an off state under a high voltage, and leakage current in the region beneath the drain is greatly reduced. Thereby, high voltage performances of the semiconductor power device are improved, and it is avoided that charges accumulates and dynamic resistance increases when carriers (e.g., electrons or holes) are injected into the insulating buffer layer under high voltage. Moreover, the above replacement decreases capacitive coupling between the drain electrode and the conductive substrate, such that parasitic capacitance between a source grounding structure and a gate grounding structure is reduced. Thereby, the device has a smaller switching loss and higher operation efficiency under high frequency. That is, the semiconductor power device according to embodiments of the present disclosure has improved dynamic resistance characteristics, improved high voltage performances, and reduced parasitic capacitance.

Furthermore, the back electrode may have the structure of the dual-level back field plate or the multi-level back field plate. That is, the back electrode may comprise an auxiliary field plate of another level, or even more auxiliary field plates of different levels on the insulating substrate portion. Thereby, a field plate at a front side of the chip can be assisted from a back side of the chip for further improving distribution of the electric field in the depletion region, especially under a high voltage.

Furthermore, there is the preset distance between an edge of the insulating substrate portion and an edge of the gate field plate in the semiconductor power device. When there are n levels of field plates at a surface of the semiconductor power device, the back electrode and conductive substrate portion structure actually forms an $(n+1)^{th}$ level field plate. Thereby, distribution of the electric field in the channel layer is further improved, and high voltage performances of the semiconductor power device are improved.

The insulating buffer layer may be doped with appropriate dopants, so as to compensate for fixed charges due to defects in the insulating buffer layer. Thereby, the insulating buffer layer has good insulation performances.

Herein the method for manufacturing the semiconductor power device is configured to manufacture the foregoing semiconductor power device. A semiconductor power device manufactured through such method has the same technical effects as the semiconductor power device according to embodiments of the present disclosure.

BRIEF DESCRIPTION OF THE DRAWINGS

Hereinafter drawings to be applied in embodiments of the present disclosure or in conventional technology are briefly described, in order to clarify illustration of technical solutions according to embodiments of the present disclosure or in conventional technology. Apparently, the drawings in the following descriptions are only some embodiments of the present disclosure, and other drawings may be obtained by those skilled in the art based on the provided drawings without exerting creative efforts.

REFERENCE NUMERALS

| | |
|---|---|
| 101: substrate layer; | 101-1: conductive substrate portion; |
| 101-2: insulating substrate portion; | 102: insulating buffer layer; |
| 103: channel layer; | 104: barrier layer; |
| 105: dielectric layer; | 106: passivation layer; |
| 107: source electrode; | 108: gate electrode; |
| 109: gate field plate; | 110: drain electrode; |
| 111: back electrode; | 112: source field plate; |
| 102-1: control region; | 102-2: drift region; |
| 102-3: high-voltage insulation region; | A: preset distance. |

DETAILED DESCRIPTION

Hereinafter technical solutions in the embodiments of the present disclosure will be described clearly and completely in conjunction with the accompanying drawings in the embodiments of the present disclosure, in order to enable those skilled in the art to better understand solutions of the present disclosure. Apparently, the embodiments described are only some, not all embodiments of the present disclosure. All other embodiments obtained by those skilled in the art without creative efforts fall within the scope of protection of the present disclosure based on embodiments of the present disclosure.

Figure 1:
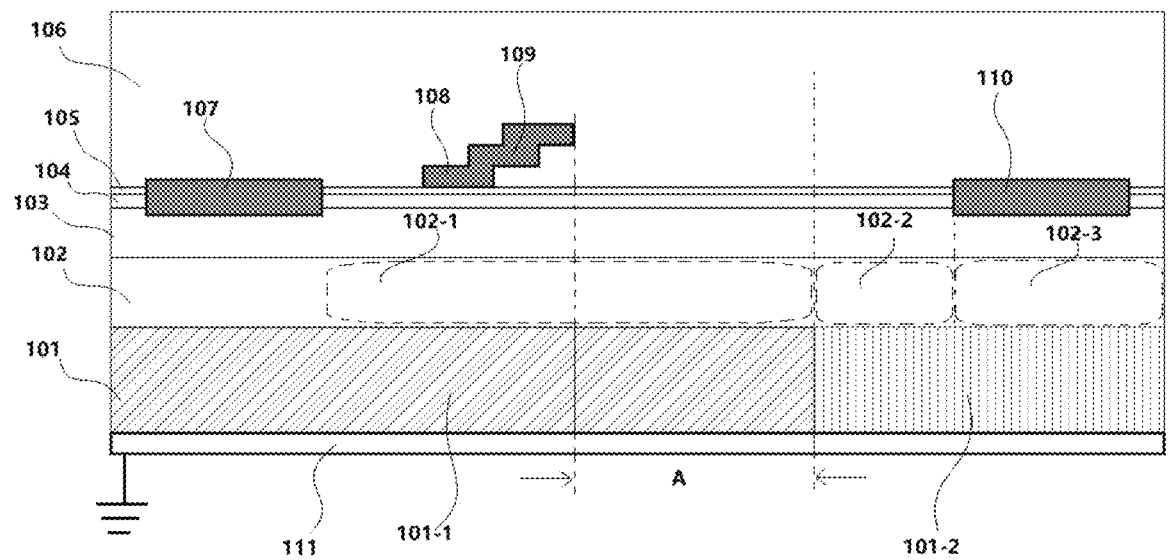
FIG. 1 is a schematic structural diagram of a semiconductor power device according to an embodiment of the present disclosure.
Figure 2:
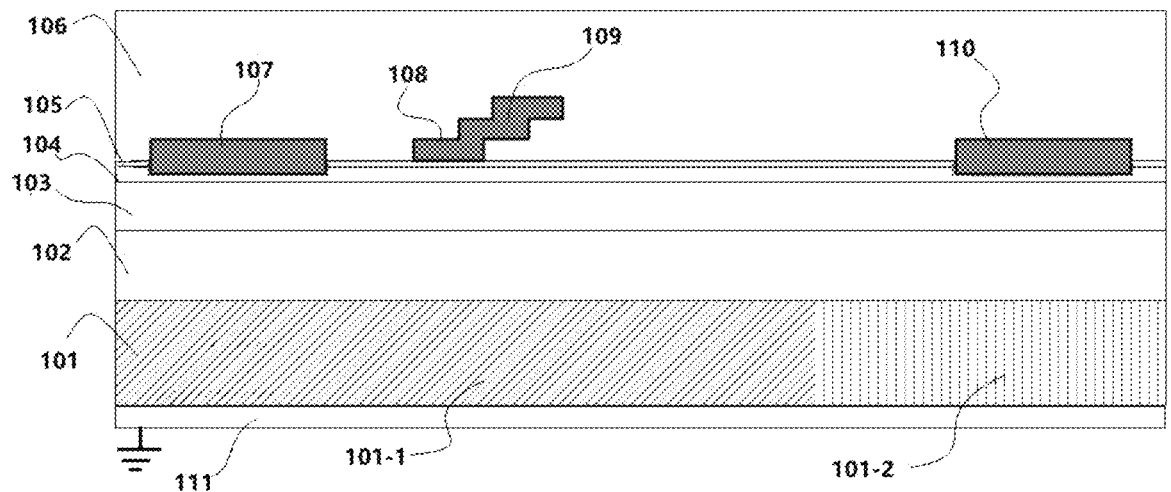
FIG. 2 is a schematic structural diagram of a semiconductor power device according to another embodiment of the present disclosure.

Reference is made to FIGS. 1 and 2. According to an embodiment of the present disclosure, a semiconductor power device comprises a back electrode 111, a substrate layer 101, an insulating buffer layer 102, a channel layer 103, a barrier layer 104, a dielectric layer 105, and a passivation layer 106, which are stacked in the above-listed sequence from bottom to top.

The source electrode 107 and the drain electrode 110 each comprises an upper surface of embedded in the passivation layer 106. The source electrode 107 and the drain electrode 110 go through the dielectric layer 105 and contact the barrier layer 104. Alternatively, the source electrode 107 and the drain electrode 110 go through the dielectric layer 105 and the barrier layer 104 and contact the channel layer 103. In the latter case, the source electrode 107 and the drain electrode 110 each may comprise a lower surface embedded in the channel layer 103. The gate electrode 108 and the gate field plate 109 are disposed in the passivation layer 106.

The substrate layer comprises a conductive substrate portion 101-1 and an insulating substrate portion 101-2. Along a direction parallel to a surface of the substrate layer, there is a preset distance between a boundary, which is between the conductive substrate portion 101-1 and the insulating substrate portion 101-2, and the gate field plate 109. The conductive substrate portion and the back electrode form a back field plate within a length of the preset distance.

The insulating buffer layer 102 comprises a control region 102-1, a drift region 102-2, and a high-voltage insulation region 102-3. The high-voltage insulation region 102-3 is located beneath the drain electrode 110. Along the direction parallel to the surface of the substrate layer, the control region 102-1 extends from the edge of the source electrode 107 facing the gate electrode 108 to the boundary between the conductive substrate portion 101-1 and the insulating substrate portion 101-2. The drift region 102-2 is located between the high-voltage insulation region 102-3 and the control region 102-1.

FIG. 1 shows an example in which the source electrode 107 and the drain electrode 110 go through the dielectric layer 105 and contact the barrier layer 104. FIG. 2 shows another example in which the source electrode 107 and the drain electrode 110 go through the dielectric layer 105 and the barrier layer 104 and contact the channel layer 103. In an embodiment, thermal conductivity of the insulating substrate portion 101-2 is greater than thermal conductivity of the conductive substrate portion 101-1. The insulating substrate portion 101-2 may be made of diamond. In comparison with a case of the whole substrate being conductive, applying the insulating substrate portion 101-2 having higher thermal conductivity is capable to achieve better heat dissipation performances of the semiconductor power device. Thus, heat generated under high-power operation can dissipate fast, which reduces thermal resistance between a chip and an ambient environment. Addressed is an issue that in conventional semiconductor power devices, the isolation trench formed through etching hinders heat dissipation.

As shown in FIG. 1, the insulating buffer layer 102 beneath the channel layer 103 and above the substrate layer 101 is divided into three regions, that is, the control region 102-1, the drift region 102-2, and the high-voltage insulation region 102-3.

The control region 102-1 refers to a region of the insulating buffer layer 102 that extends from the edge of the source electrode 107 facing the gate electrode 108 to the boundary between the conductive substrate portion 101-1 and the insulating substrate portion 101-2. The control region 102-1 is configured to control distribution of an electric field under high voltage through the gate electrode 108 and the gate field plate 109 which are at a front side of the semiconductor device and through the grounded insulating buffer layer 102, so as to improve uniformness of the distribution the electric field. A bottom of the control region 102-1 needs to be grounded, and hence it is not appropriate to isolate it from the back electrode 111 via an insulating material. Hence, the conductive substrate portion 101-1 needs to be retained.

The high-voltage insulation region 102-3 refers to a region of the insulating buffer layer 102 beneath the drain electrode 110. The high-voltage insulation region 102-3 is mainly for reducing leakage current and providing a support for high voltage. A conductive substrate beneath the high-voltage insulation region 102-3 needs to be removed and replaced with the insulating substrate portion 101-2.

The drift region 102-2 refers to a region of the insulating buffer layer region located between the high-voltage insulation region 102-3 and the control region 102-1. The drift region 102-2 is configured to provide a channel for carriers (e.g., electrons) to pass quickly when the semiconductor power device is on and support a voltage adaptively when the semiconductor power device transitions to an off-state. A conductive substrate beneath the drift region 102-2 needs to be removed and replaced with the insulating substrate portion 101-2.

In an embodiment, the preset distance A ranges from 2 um to 20 um. The preset distance A is configured such that the edge of the insulating substrate portion 101-2 would not exceed a nearest position of the gate field plate 109 with respect to the drain electrode 110. Thereby, in a case that n levels of field plates are provided at a surface of the semiconductor power device, the back electrode 111 and the conductive substrate portion 101-1 is capable to jointly serve as a field plate of an $(n+1)^{th}$ level within the length of the preset distance A, which further improves distribution of the electric field in the channel layer and improves high voltage performances of the device.

The conductive substrate beneath the drift region 102-2 and high-voltage insulation region 102-3 may be removed through techniques such as photolithography, dry etching, or wet etching. Then, an insulating material may be provided to form an insulating substrate portion 101-2 as replacement of the removed conductive substrate. Thereby, excellent performances of the manufactured semiconductor power devices can be achieved.

Herein the semiconductor power device comprises the back electrode 111, the substrate layer 101, the insulating buffer layer 102, the channel layer 103, the barrier layer 104, the dielectric layer 105, and the passivation layer 106, which are stacked sequentially from bottom to top. A conventional homo-conductive substrate layer is replaced with the hybrid substrate layer 101 comprising the conductive substrate portion 101-1 and the insulating substrate portion 101-2. The insulating buffer layer 102 comprises the control region 102-1, the drift region 102-2, and the high-voltage insulation region 102-3. The conductive substrate portion 101-1 is located beneath the control region 102-1, and the insulating substrate portion 101-2 is located beneath the drift region 102-2 and high-voltage insulation region 102-3. In such structure, the conductive substrate beneath the drain is removed and replaced with the insulating substrate portion 101-2, such that an intensity of a vertical electric field beneath the drain can be significantly reduced in an off-state under a high voltage, and leakage current in the region beneath the drain is greatly reduced. Thereby, high voltage performances of the semiconductor power device are improved, and it is avoided that charges accumulates and dynamic resistance increases when carriers are injected into the insulating buffer layer 102 under high voltage. Moreover, the above replacement decreases capacitive coupling between the drain electrode and the conductive substrate, such that parasitic capacitance between a source grounding structure and a gate grounding structure is reduced. Thereby, the device has a smaller switching loss and higher operation efficiency under high frequency. That is, the semiconductor power device according to embodiments of the present disclosure has improved dynamic resistance characteristics, improved high voltage performances, and reduced parasitic capacitance.

Figure 13:
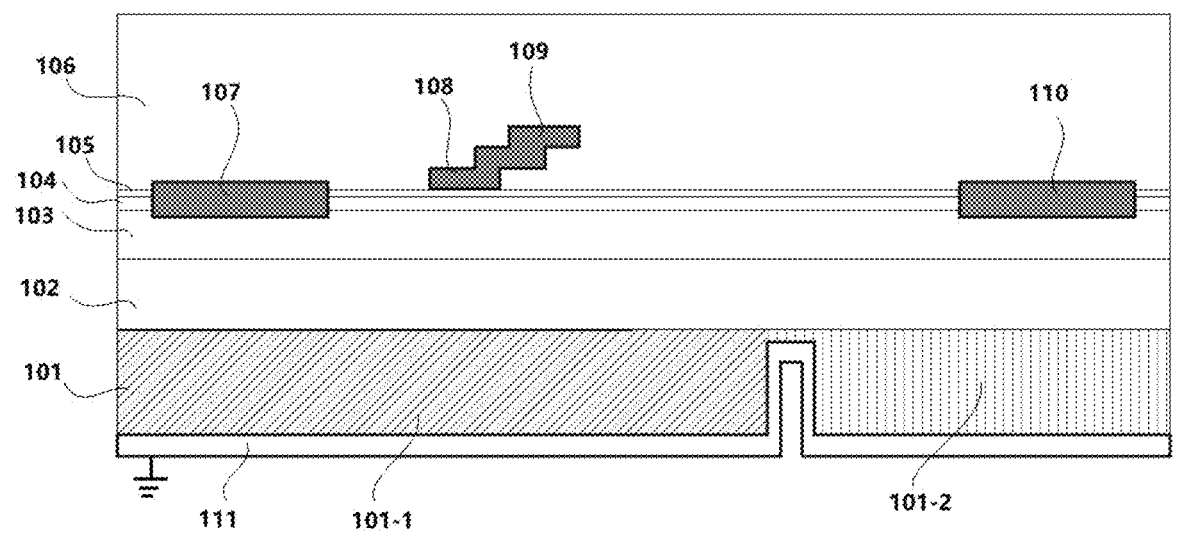
FIG. 13 is a schematic diagram of a semiconductor power device in which a back electrode has a structure of a dual-level back field plate according to an embodiment of the present disclosure.
Figure 14:
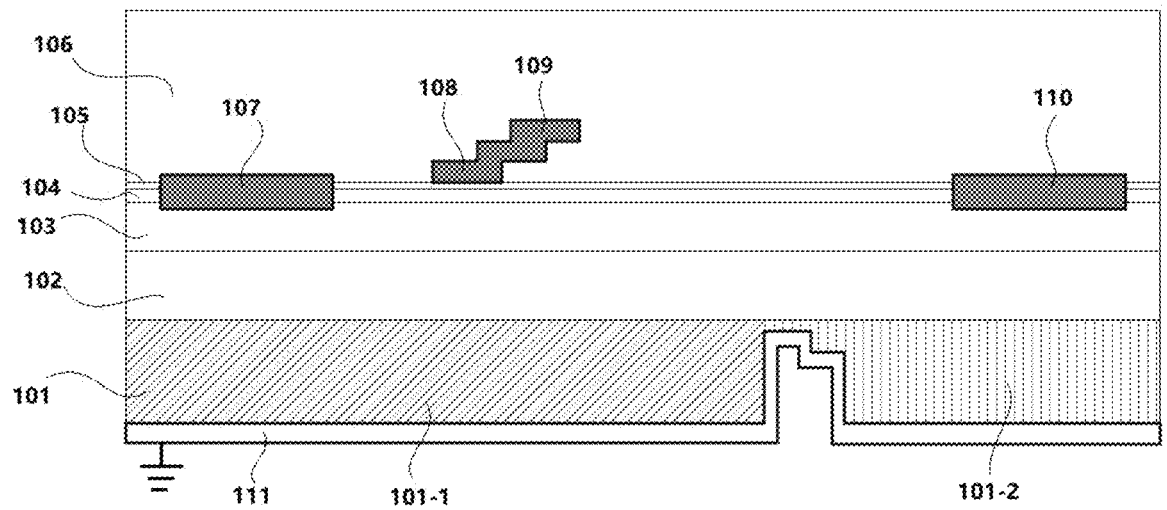
FIG. 14 is a schematic diagram of a semiconductor power device in which a back electrode has a structure of a multi-level back field plate according to an embodiment of the present disclosure.

Reference is made to FIGS. 13 and 14. In an embodiment, the back electrode on the insulating substrate portion 101-2 has a structure of a dual-level back field plate or a structure of a multi-level back field plate. That is, the back electrode 111 may comprise an auxiliary field plate of another level, or even more auxiliary field plates of different levels on the insulating substrate portion 101-2. Thereby, a field plate at a front side of the chip can be assisted from a back side of the chip for further improving distribution of the electric field in the depletion region, especially under a high voltage. Specifically, in an off-state under a high voltage, carriers in the channel are depleted first at a position close to the gate or the gate field plate, and a depletion region extends toward the drain as the voltage increases. During such process, the back field plate is capable to serve as a means for modulating the electric field.

The technical solutions provided herein are applicable to gallium nitride power devices, and may further be applicable to other semiconductor power devices, e.g., gallium oxide power devices, aluminum nitride power devices, silicon carbide power devices, and the like.

Figure 3:
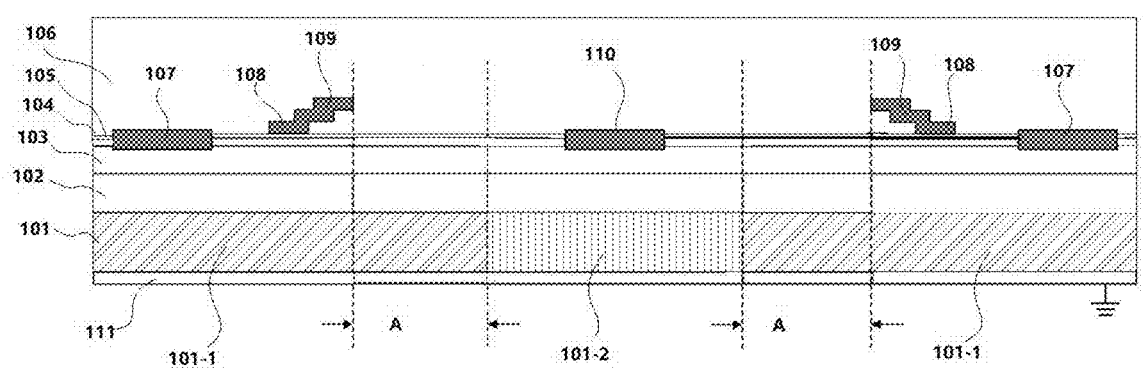
FIG. 3 is a schematic structural diagram of semiconductor power devices sharing a drain electrode according to an embodiment of the present disclosure.

FIG. 1 only shows an exemplary structure of the semiconductor power device according to an embodiment of the present disclosure. Those skilled in the art may derive other similar structures of semiconductor power device(s) on a basis of the structure(s) according to embodiments of the present disclosure. As an example, reference is made to FIG. 3, which shows a structure of semiconductor power devices sharing a common drain electrode 110 on a basis of the foregoing embodiment(s).

Figure 10:
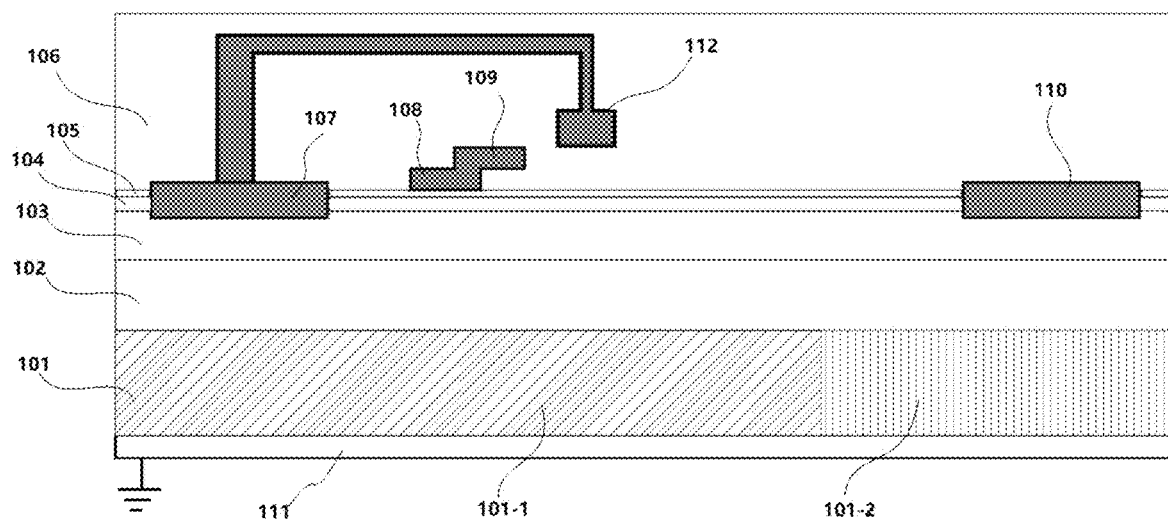
FIG. 10 is a schematic structural diagram of a semiconductor power device which comprises both a source field plate and a gate field plate according to an embodiment of the present disclosure.
Figure 11:
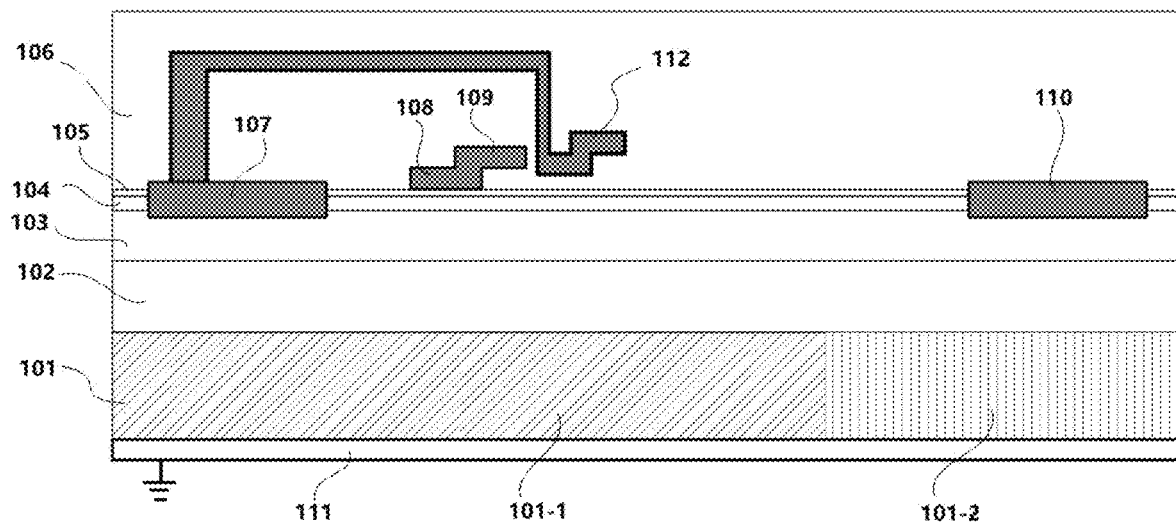
FIG. 11 is a schematic structural diagram of a semiconductor power device comprising a multi-level source field plate according to an embodiment of the present disclosure.
Figure 12:
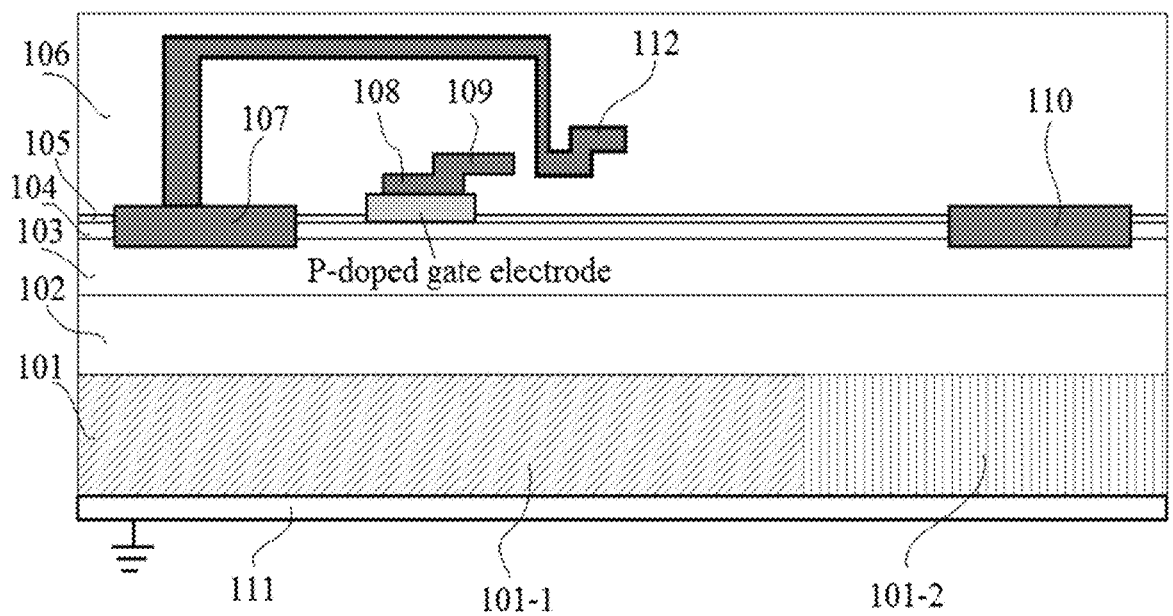
FIG. 12 is a schematic structural diagram of a semiconductor power device which comprises a p-doped gate structure and a multi-level source field plate according to an embodiment of the present disclosure.

Moreover, on a basis of the above embodiment(s), the semiconductor power device may alternatively comprise a source field plate 112 or comprise both the source field plate 112 and the gate field plate 109. In a case that the semiconductor power device comprises the source field plate 112, details such as arrangement and a position of the source field plate 112 in the passivation layer 106 may refer to those of the gate field plate 109 in the passivation layer 106. In a case that the semiconductor power device comprises the source field plate 112 and the gate field plate 109, on a basis of the above embodiment(s), the source field plate 112 may be added into the passivation layer 106 along with the gate field plate 109 and in a manner similar to forming the gate field plate 109. A structure of the semiconductor power device comprising both the source field plate and the gate field plate may be as shown in FIG. 10. The technical solutions provided herein is also applicable to a semiconductor device having a multi-level source field plate, as shown in FIGS. 11 and 12. FIG. 11 shows a structure of a semiconductor power device comprising a multi-level source field plate, and FIG. 12 shows a structure of a semiconductor power device comprising a p-doped gate structure and the multi-level source field plate.

In an embodiment, the insulating buffer layer 102 is doped, where dopants may be Fe, C, or another element. The channel layer 103 may not be doped. The insulating buffer layer doped with appropriate dopants is capable to compensate for fixed charges due to defects in the insulating buffer layer, and hence good insulating performances can be achieved. When the device is turned on, current flows between the source and drain via the channel layer 103, and hence the channel layer shall have impurities as few as possible. Otherwise, the impurities may introduce carrier scattering, carrier recombination, or other effects which reduces an output current of the device.

In an embodiment, an aluminum nitride layer is disposed between the barrier layer 104 and the channel layer 103. A thickness of the aluminum nitride layer may range from 0.5 nm to 1 nm. The aluminum nitride layer is configured to improve the output current and suppress current collapse.

Figure 4:
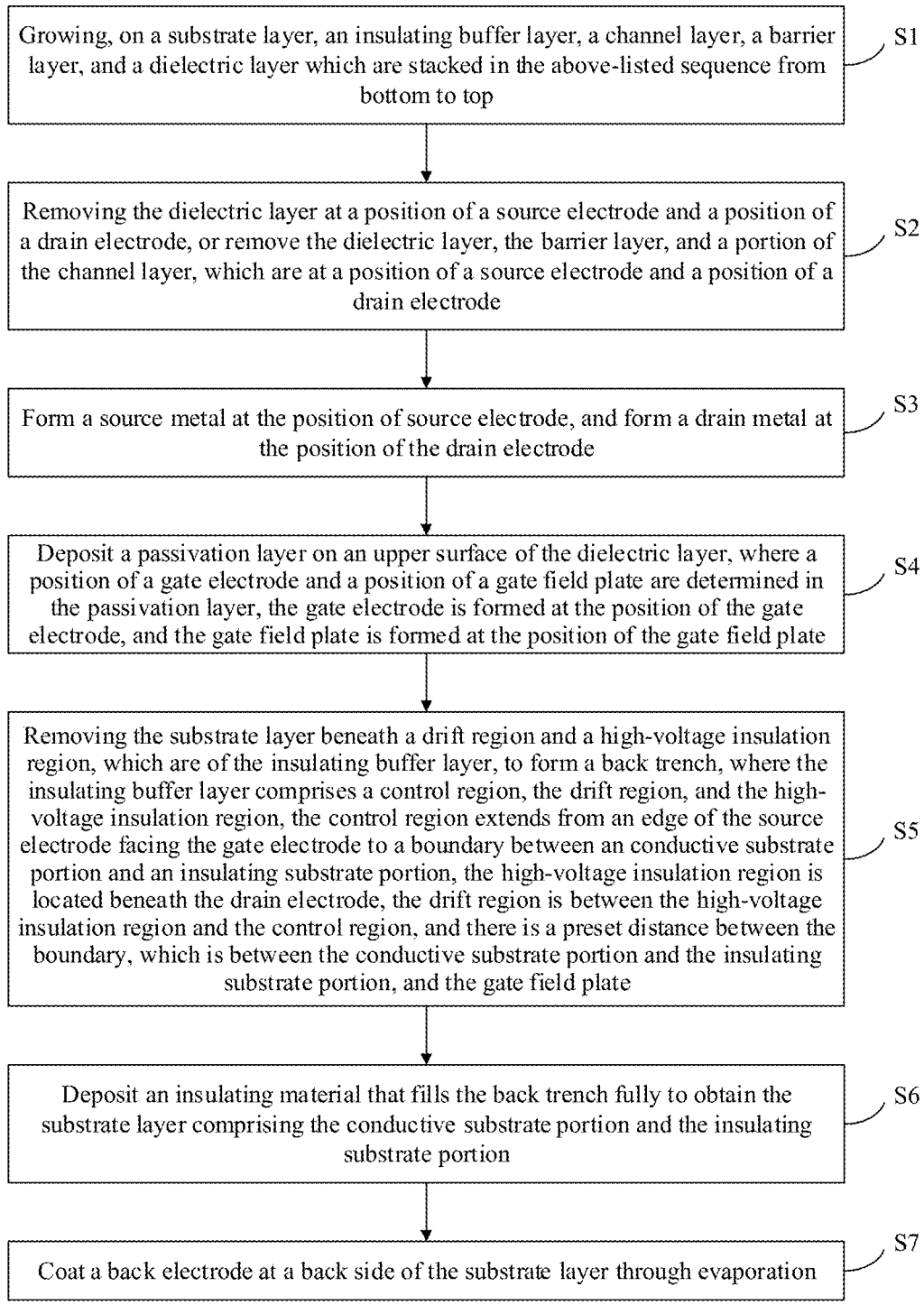
FIG. 4 is a schematic flow chart of a method for manufacturing a semiconductor power device according to an embodiment of the present disclosure.

Reference is made to FIG. 4. In an embodiment, a method for manufacturing a semiconductor power device comprises steps S1 to S7.

In step S1, an insulating buffer layer 102, a channel layer 103, a barrier layer 104, and a dielectric layer 105 which are stacked in the above-listed sequence from bottom to top are grown on a substrate layer 101.

Figure 5:
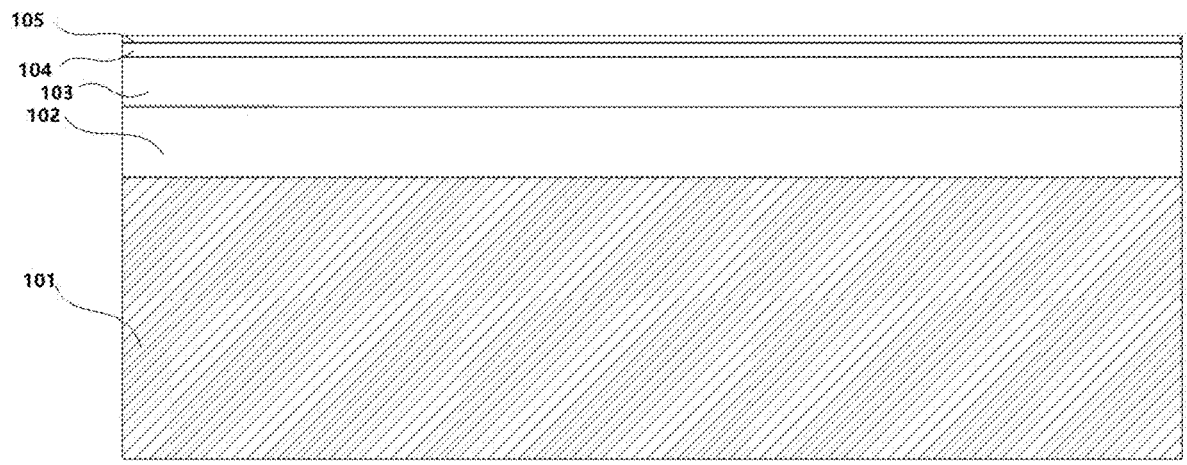
FIG. 5 is a schematic structural diagram of an epitaxial wafer for a semiconductor power device according to an embodiment of the present disclosure.

In an embodiment, the insulating buffer layer 102, the channel layer 103, the barrier layer 104, and the dielectric layer 105 are first grown on the substrate layer 101 in the above-listed sequence from bottom to top. In an embodiment, the above layers are sequentially grown through MOCVD epitaxy on a p-doped conductive substrate (e.g., silicon substrate). For example, a single layer of $Al_xGa_{1-x}N$ (where x ranges from 0 to 1) thin film or a combination of multiple $Al_xGa_{1-x}N$ (where x ranges from 0 to 1) thin films serves as the insulating buffer layer 102. In an embodiment, a thickness of the insulating buffer layer ranges from 3 um to 6 um, and may preferably be 6 um. In an embodiment, the channel layer 103 is a 300 nm GaN layer grown on the insulating buffer layer 20. A thickness of the channel layer 103 may range from 100 nm to 700 nm. In an embodiment, the barrier layer 104 is a 15 nm AlGaN layer grown on the channel layer 103. A thickness of the barrier layer 104 may range from 10 nm to 70 nm. In an embodiment, the dielectric layer 105 is a 30 nm silicon nitride layer grown on the barrier layer 104. The dielectric layer 105 may be silicon oxide, silicon nitride, aluminum oxide, gallium oxide, silicon oxynitride, or another insulating material. A manufactured epitaxial wafer may be as shown in FIG. 5. Besides the MOVCD epitaxy, the above semiconductor materials may be grown through, for example, MBE, HVPE, or PLD. The conductive substrate portion 101-1 in the substrate layer 101 may be a monocrystalline substrate make of, for example, SiC, GaN, AlN, or ZnO.

In step S2, the dielectric layer 105 at a position of a source electrode 107 and a position of a drain electrode 110 is removed. Alternatively, the dielectric layer 105, the barrier layer 104, and a portion of the channel layer 103, which are at a position of a source electrode and a position of a drain electrode, are removed.

The position of the source electrode 107 and the position of the drain electrode 110 are defined by photolithography on a surface of the epitaxial wafer. The materials of the dielectric layer 105, the barrier layer 104, and the channel layer 103 are removed from the position of the source electrode 107 and the position of the drain electrode 110 through dry etching or wet etching. Only a small part of the channel layer 103 may be necessary to be removed.

In step S3, a source metal is formed at the position of source electrode, and a drain metal is formed at the position of the drain electrode.

Figure 6:
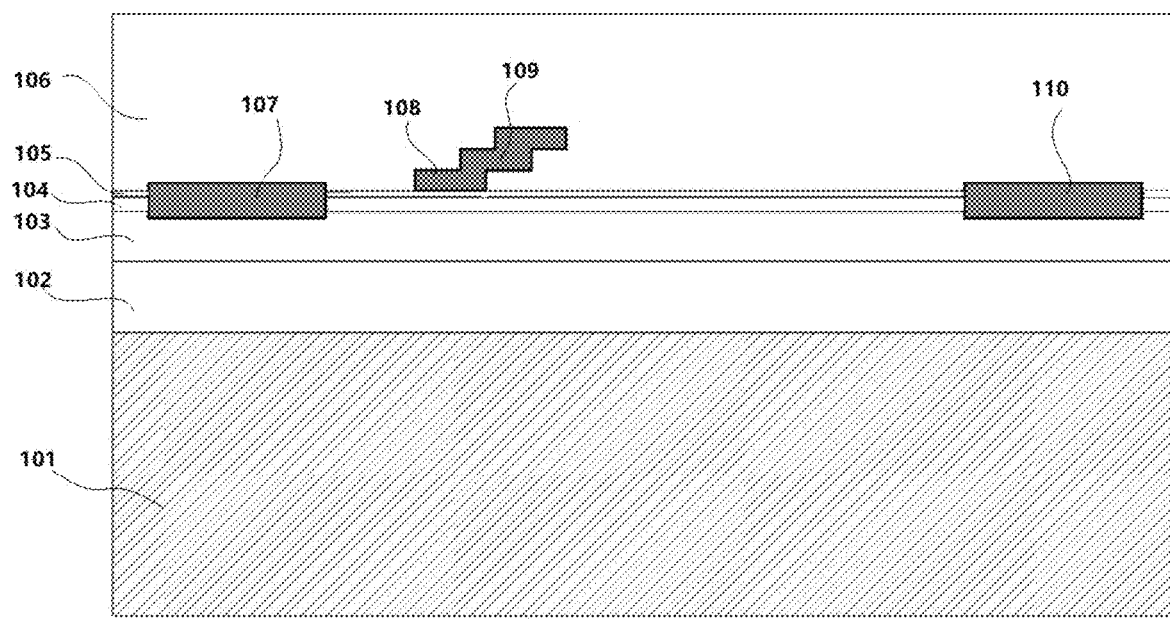
FIG. 6 is a schematic structural diagram showing positions of a source electrode, a drain electrode, a gate electrode, and a gate field plate according to an embodiment of the present disclosure.

The source electrode 107 and the drain electrode 110 may be fabricated through metal evaporation, for example, through physical vapor deposition (PVD, such as magnetron sputtering), electron beam evaporation, thermal evaporation, or the like. Ohmic contacts of the drain electrode 107 and the source electrode 110 are achieved through annealing an alloy of the drain electrode 110 and the source electrode 107. A structure having the fabricated source electrode 107 and the fabricated drain electrode 110 may be as shown in FIG. 6.

In step S4, a passivation layer 106 is deposited on an upper surface of the dielectric layer 105, where a position of a gate electrode 108 and a position of a gate field plate 109 are determined in the passivation layer, the gate electrode 108 is formed at the position of the gate electrode 108, and the gate field plate 109 is formed at the position of the gate field plate 109.

The position of the gate electrode 108 and the position of the gate field plate 109 may be defined through a combination of techniques such as deposition of the passivation layer 106, photolithography, and metal etching. Thereby, the gate electrode 108 and gate field plate 109 can be formed their respective positions, as shown in FIG. 6.

In step S5, the substrate layer 101 beneath a drift region 102-2 and a high-voltage insulation region 102-3, which are of the insulating buffer layer 102, are removed to form a back trench, where the insulating buffer layer 102 comprises a control region 102-1, the drift region 102-2, and the high-voltage insulation region 102-3, the high-voltage insulation region 102-3 is located beneath the drain electrode, the control region 102-1 extends from an edge of the source electrode 107 facing the gate electrode 103 to a boundary between a conductive substrate portion 101-1 and an insulating substrate portion 102-2 along a direction parallel with a surface of the substrate layer 101, the drift region 102-2 is between the high-voltage insulation region 102-3 and the control region 102-1, and there is a preset distance A between the boundary, which is between the conductive substrate portion 101-1 and the insulating substrate portion 101-2, and the gate field plate 109 along the direction parallel with the surface of the substrate layer 101.

Figure 7:
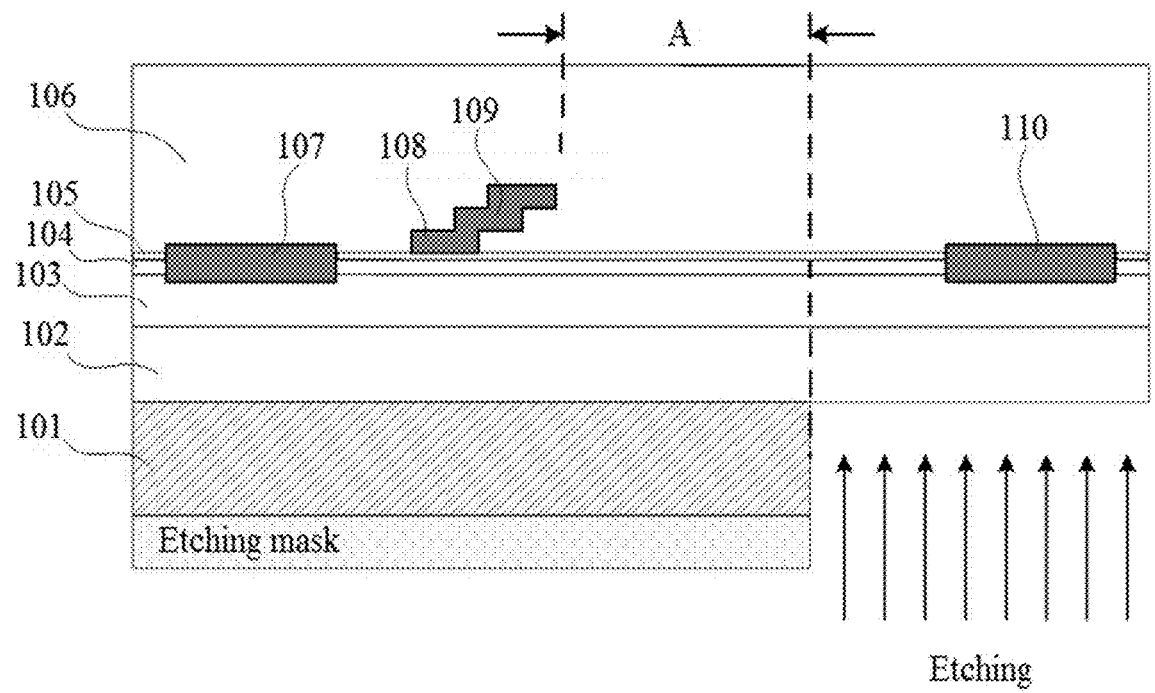
FIG. 7 is a schematic structural diagram for a process of etching an insulating substrate portion of a semiconductor power device according to an embodiment of the present disclosure.

Processing on a front side of a wafer is completed after step S4, and then processing on a back side of the wafer starts. The substrate layer 101 beneath the drift region 102-2 and the high-voltage insulation region 102-3 of the insulating buffer layer 102 is removed from the back side of the wafer through photolithography and dry etching, so as to form the back trench as shown in FIG. 7. Accordingly, a distance between the edge of the back trench and the edge of the gate field plate 109 along the direction parallel with the surface of the substrate layer 101 is equal to the preset distance A. The preset distance A may range from 2 um to 20 um. In case of an anisotropic substrate capable to be etched along crystal direction(s), the back trench may be alternatively formed through wet etching.

In step S6, an insulating material that fills the back trench fully is deposited to obtain the substrate layer 101 comprising the conductive substrate portion 101-1 and the insulating substrate portion 101-2. Thermal conductivity of the insulating substrate portion 101-2 may be greater than thermal conductivity of conductive substrate portion 101-1.

Figure 8:
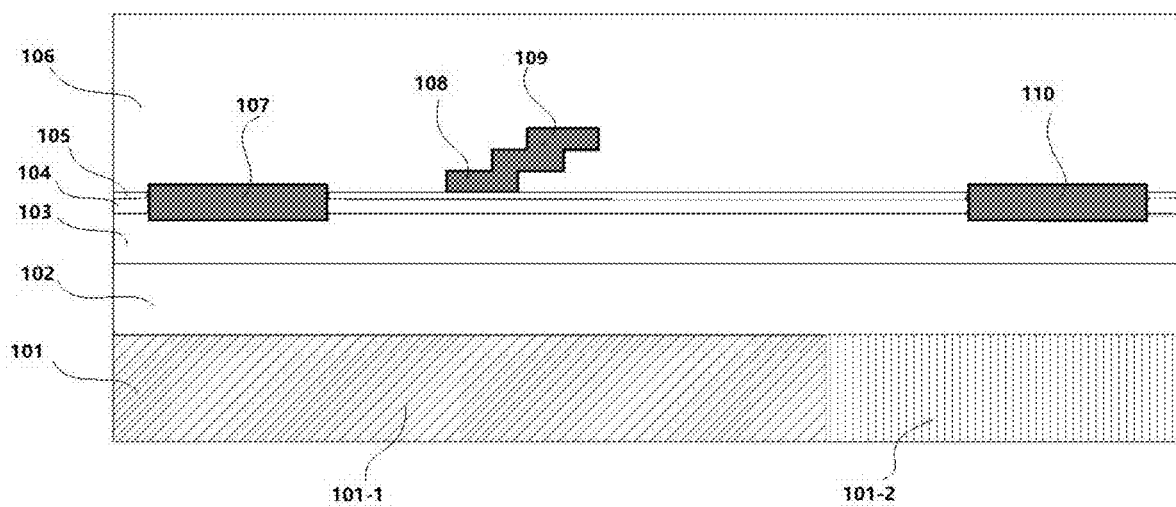
FIG. 8 is a schematic structural diagram for a process of forming an insulating substrate portion of a semiconductor power device according to an embodiment of the present disclosure.

After fabricating the back trench, a layer of an insulating material is deposited on the back side of the wafer through CVD or PVD, so as to fill the back trench. The insulating material filling the back trench may be silicon nitride, silicon oxide, aluminum nitride, gallium oxide, or the like. In an embodiment, the insulating material has is one having high thermal conductivity, such as diamond. After the back trench is filled, the substrate layer 101 comprising the conductive substrate portion 101-1 and the insulating substrate portion 101-2 is obtained, as shown in FIG. 8.

In step S7, a back electrode is coated at a back side of the substrate layer through evaporation.

Figure 9:
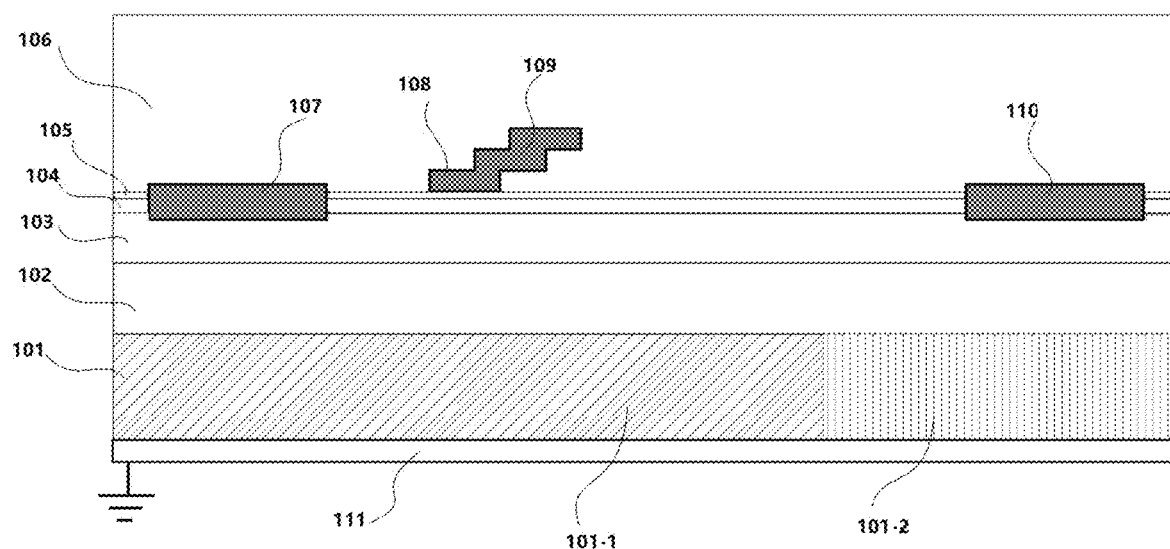
FIG. 9 is a schematic structural diagram of a semiconductor power device manufactured through a method according to an embodiment of the present disclosure.

After the substrate layer 101 has been processed, the back electrode 111 is coated at the back of the wafer through metal evaporation, as shown in FIG. 9, and thereby processing of the wafer is completed. Reference is made to FIG. 13 and FIG. 14. In some embodiments, the back electrode 111 may have a structure of a dual-level back field plate or a structure of a multi-level back field plate. That is, the back electrode 111 on the insulating substrate portion 101-2 may comprise an additional field plate of a different level or even multiple additional field plates of different levels. The multi-level back field plate is configured to assist, from the back side of a chip, front field plate(s) of the chip to further improve the distribution of the electric field in the depletion region. Such advantage is especially obvious under a high voltage. Specifically, in an off-state under a high voltage, carriers in the channel are depleted first at a position close to the gate or the gate field plate, and a depletion region extends toward the drain as the voltage increases. During such process, the back field plate is capable to serve as a means for modulating the electric field.

In an embodiment, after the step S4 and before the step S5, the substrate layer 101 is thinned to a preset thickness through grinding. The preset thickness may range from 30 μm to 400 μm. In another embodiment, after step S6 and before the step S7, the substrate layer 101 is thinned to a preset thickness through grinding. The preset thickness may also range from 30 μm to 400 μm.

In an embodiment, an aluminum nitride layer is disposed between the barrier layer 104 and the channel layer 103. A thickness of the aluminum nitride layer may range from 0.5 nm to 1 nm. That is, in the step S1, the insulating buffer layer 102, the channel layer 103, the aluminum nitride layer, the barrier layer 104, and the dielectric layer 105 are sequentially grown on the substrate layer 101 from bottom to top. In the step S2, the dielectric layer 105, the barrier layer 104, the aluminum nitride layer, and channel layer 103 material may be removed at the position of the source electrode 107 and the position of the drain electrode 110. The aluminum nitride layer is configured to improve an output current and suppress current collapse.

Herein the semiconductor power device may alternatively comprise a source field plate 112 or comprise both the source field plate 112 and the gate field plate 109. In a case that the semiconductor power device comprises the source field plate 112, details such as arrangement and a position of the source field plate 112 in the passivation layer 106 may refer to those of the gate field plate 109 in the passivation layer 106. In a case that the semiconductor power device comprises the source field plate 112 and the gate field plate 109, on a basis of the above embodiment(s), the source field plate 112 may be added into the passivation layer 106 along with the gate field plate 109 and in a manner similar to forming the gate field plate 109. A structure of the semiconductor power device comprising both the source field plate and the gate field plate may be as shown in FIG. 10.

As described above, the above embodiments are only intended to describe the technical solutions of the present disclosure, and not to limit the present disclosure. Although the present disclosure is described in detail with reference to the above embodiments, those skilled in the art should understand that, modifications can be made to the technical solutions recorded in the above embodiments, or equivalent replacements can be made to some of the technical features thereof, and the modifications and the replacements will not make the corresponding technical solutions deviate from the spirit and the scope of the technical solutions of the embodiments of the present disclosure.

The invention claimed is:

1. A semiconductor power device, comprising:
    a back electrode, a substrate layer, an insulating buffer layer, a channel layer, a barrier layer, a dielectric layer, and a passivation layer, which are stacked in the above-listed sequence from bottom to top, wherein:
    a source electrode and a drain electrode go through the dielectric layer and the barrier layer, wherein the source electrode and the drain electrode contact the channel layer;
    a gate electrode and a top gate field plate are disposed in the passivation layer;
    the substrate layer comprises a conductive substrate portion and an insulating substrate portion, wherein there is a preset lateral distance between the top gate field plate and a vertical extension of a boundary separating the conductive substrate portion and the insulating substrate portion, wherein the preset distance is greater than zero, and wherein the conductive substrate portion and the back electrode form a back field plate within a length of the preset distance;
    the insulating buffer layer is divided into a control region, a high-voltage insulation region, and a drift region, wherein:
        the control region is located between an edge of the source electrode facing the gate electrode and the boundary separating the conductive substrate portion and the insulating substrate portion;
        the high-voltage insulation region is in the insulating buffer layer beneath the drain electrode; and
        the drift region is between the high-voltage insulation region and the control region,
    wherein the control region is configured to optimize electric field distribution, and wherein the drift region is configured to support a voltage adaptively when transitioning from an on-state to the off-state, wherein the channel layer above the drift region provides a path for electrons to drift, and wherein the high-voltage insulation region has a function of reducing leakage current and decreasing capacitive coupling between the drain electrode and the conductive substrate portion; and
    the insulating substrate portion is in the substrate layer located beneath the drift region and the high-voltage insulation region.

2. The semiconductor power device according to claim 1, wherein the preset distance ranges from 2 um to 20 um.

3. The semiconductor power device according to claim 1, wherein a back electrode corresponding to the insulating substrate portion has a structure of a dual-level back field plate or a multi-level back field plate, wherein the structure of the dual-level back field plate comprises field plates of two levels, and wherein the structure of the multi-level back field plate comprises field plates of multiple levels.

4. The semiconductor power device according to claim 1, further comprising an aluminum nitride layer located between the barrier layer and the channel layer.

5. The semiconductor power device according to claim 1, wherein the insulating buffer layer is counter-doped and the channel layer is not intentionally doped.

6. The semiconductor power device according to claim 1, wherein a lower surface of the source electrode and a lower surface of the drain electrode is embedded in the channel layer.

7. The semiconductor power device according to claim 5, wherein the insulating buffer layer is doped with one or both of Fe and C.

8. A method for manufacturing a semiconductor power device, comprising:
   providing a substrate layer;
   forming an insulating buffer layer, a channel layer, a barrier layer, and a dielectric layer, which are stacked in the above-listed sequence from bottom to top on the substrate layer, wherein the insulating buffer layer comprises a control region, a high-voltage insulation region, and a drift region of the semiconductor power device;
   forming a source electrode and a drain electrode that both go through the dielectric layer and the barrier layer, wherein the source electrode and the drain electrode contact the channel layer;
   forming a passivation layer that is located on the dielectric layer;
   forming a gate electrode and a top gate field plate that are located in the passivation layer,
   forming a back electrode that is located at a side of the substrate layer away from the insulating buffer layer, and wherein:
   the substrate layer comprises a conductive substrate portion and an insulating substrate portion, wherein there is a preset distance between the top gate field plate and a vertical extension of a boundary separating the conductive substrate portion and the insulating substrate portion, wherein the preset distance is greater than zero, and wherein the conductive substrate portion and the back electrode form a back field plate within a length of the preset distance;
   the control region is located between an edge of the source electrode facing the gate electrode and the boundary separating the conductive substrate portion and the insulating substrate portion;
   the high-voltage insulation region is in the insulating buffer layer the drain electrode; and
   the drift region is between the high-voltage insulation region and the control region,
   wherein the control region is configured to optimize electric field distribution, wherein the drift region is configured to support a voltage adaptively when transitioning from an on-state to the off-state and to provide a path for electrons to drift, and wherein the high-voltage insulation region and the insulating substrate portion underneath together have a function of reducing leakage current and decreasing capacitive coupling between the drain electrode and the conductive substrate; and
   the insulating substrate portion is in the substrate layer located beneath the drift region and the high-voltage insulation region.

9. The method according to claim 8, wherein, forming the source electrode and the drain electrode that both go through the dielectric layer and the barrier layer comprises: removing the dielectric layer, the barrier layer, and a portion of the channel layer, which are at a position of the source electrode and a position of the drain electrode, forming the source metal at the position of the source electrode, and forming the drain metal at the position of the drain electrode,
   before forming the back electrode that is located at the side of the substrate layer away from the insulating buffer layer, the method further comprises: removing a portion of the substrate layer beneath the drift region and the high-voltage insulation region of the insulating buffer layer, to form a back trench, and depositing an insulating material that fills the back trench fully to obtain the substrate layer comprising the conductive substrate portion and the insulating substrate portion, and
   forming the back electrode that is located at the side of the substrate layer away from the insulating buffer layer comprises: coating the back electrode at the side of the substrate layer away from the insulating buffer layer through evaporation.

10. The method according to claim 9, wherein before removing the portion of the substrate layer beneath the drift region and the high-voltage insulation region of the insulating buffer layer, the method further comprises:
    thinning the substrate layer to a preset thickness through grinding.

11. The method according to claim 9, wherein:
    thermal conductivity of the insulating material is greater than thermal conductivity of the conductive substrate portion; and
    after depositing the insulating material that fills the back trench fully and before the step of coating the back electrode at the back side of the substrate layer through the evaporation, the method further comprises:
    thinning the substrate layer to a preset thickness through grinding.

12. The method according to claim 8, wherein the preset distance ranges from 2 um to 20 um.

13. The method according to claim 9, wherein:
    forming the insulating buffer layer, the channel layer, the barrier layer, and the dielectric layer, which are stacked in the above-listed sequence from bottom to top on the substrate layer, comprises: forming the insulating buffer layer, the channel layer, an aluminum nitride layer, the barrier layer, and the dielectric layer, which are stacked in the above-listed sequence from bottom to top on the substrate layer; and
    removing the dielectric layer, the barrier layer, and the portion of the channel layer, which are at the position of the source electrode and the position of the drain electrode comprises: removing the dielectric layer, the aluminum nitride layer, the barrier layer, and the portion of the channel layer, which are at the position of the source electrode and the position of the drain electrode.

14. The method according to claim 10, wherein:
    forming the insulating buffer layer, the channel layer, the barrier layer, and the dielectric layer, which are stacked in the above-listed sequence from bottom to top on the substrate layer, comprises: forming the insulating buffer layer, the channel layer, an aluminum nitride layer, the barrier layer, and the dielectric layer, which are stacked in the above-listed sequence from bottom to top on the substrate layer; and removing the dielectric layer, the barrier layer, and the portion of the channel layer, which are at the position of the source electrode and the position of the drain electrode comprises: removing the dielectric layer, the aluminum nitride layer, the barrier layer, and the portion of the channel layer, which are at the position of the source electrode and the position of the drain electrode.

15. The method according to claim 11, wherein:

forming the insulating buffer layer, the channel layer, the barrier layer, and the dielectric layer, which are stacked in the above-listed sequence from bottom to top on the substrate layer, comprises: forming the insulating buffer layer, the channel layer, an aluminum nitride layer, the barrier layer, and the dielectric layer, which are stacked in the above-listed sequence from bottom to top on the substrate layer; and removing the dielectric layer, the barrier layer, and the portion of the channel layer, which are at the position of the source electrode and the position of the drain electrode comprises: removing the dielectric layer, the aluminum nitride layer, the barrier layer, and the portion of the channel layer, which are at the position of the source electrode and the position of the drain electrode.

16. The method according to claim 12, wherein:

forming the insulating buffer layer, the channel layer, the barrier layer, and the dielectric layer, which are stacked in the above-listed sequence from bottom to top on the substrate layer, comprises: forming the insulating buffer layer, the channel layer, an aluminum nitride layer, the barrier layer, and the dielectric layer, which are stacked in the above-listed sequence from bottom to top on the substrate layer; and removing the dielectric layer, the barrier layer, and the portion of the channel layer, which are at the position of the source electrode and the position of the drain electrode comprises: removing the dielectric layer, the aluminum nitride layer, the barrier layer, and the portion of the channel layer, which are at the position of the source electrode and the position of the drain electrode.

* * * * *